United States Patent
Kobayashi

(10) Patent No.: US 9,099,507 B2
(45) Date of Patent: Aug. 4, 2015

(54) VERTICAL HEAT TREATMENT APPARATUS AND METHOD FOR COOLING THE APPARATUS

(75) Inventor: Makoto Kobayashi, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 991 days.

(21) Appl. No.: 13/040,720

(22) Filed: Mar. 4, 2011

(65) Prior Publication Data

US 2011/0223552 A1 Sep. 15, 2011

(30) Foreign Application Priority Data

Mar. 10, 2010 (JP) ................................. 2010-053154

(51) Int. Cl.
| | |
|---|---|
| F27D 9/00 | (2006.01) |
| F27D 19/00 | (2006.01) |
| F27D 7/00 | (2006.01) |
| C23C 16/54 | (2006.01) |
| H01L 21/67 | (2006.01) |
| C23C 16/46 | (2006.01) |

(52) U.S. Cl.
CPC ........ *H01L 21/67253* (2013.01); *C23C 16/463* (2013.01); *H01L 21/67109* (2013.01)

(58) Field of Classification Search
None
See application file for complete search history.

(56) References Cited

U.S. PATENT DOCUMENTS

| | | | | |
|---|---|---|---|---|
| 2,440,052 | A | * 4/1948 | Lingen et al. ................. | 236/9 A |
| 3,794,459 | A | * 2/1974 | Meenan ............................ | 431/5 |
| 4,697,530 | A | * 10/1987 | Marcotte et al. ............... | 110/234 |
| 5,360,336 | A | * 11/1994 | Monoe ................................. | 432/5 |
| 5,447,294 | A | * 9/1995 | Sakata et al. .................... | 266/257 |
| 5,529,657 | A | * 6/1996 | Ishii .......................... | 156/345.26 |
| 5,562,383 | A | * 10/1996 | Iwai et al. ................... | 414/217.1 |
| 5,616,264 | A |   4/1997 | Nishi et al. | |
| 5,829,939 | A | * 11/1998 | Iwai et al. ...................... | 414/411 |
| 5,928,390 | A | * 7/1999 | Yaegashi et al. ............... | 29/25.01 |
| 6,059,567 | A | * 5/2000 | Bolton et al. .................... | 432/81 |
| 6,191,394 | B1 | * 2/2001 | Shirakawa et al. ......... | 219/444.1 |
| 6,394,796 | B1 | * 5/2002 | Smith ........................... | 432/229 |
| 6,409,503 | B1 | * 6/2002 | Yoshida et al. ............... | 432/239 |

(Continued)

FOREIGN PATENT DOCUMENTS

| | | |
|---|---|---|
| JP | 3111395 B2 | 11/2000 |
| JP | 2002-305189 A1 | 10/2002 |

(Continued)

OTHER PUBLICATIONS

Japanese Office Action (2010-281622) dated Jul. 23, 2013.

*Primary Examiner* — Gregory Huson
*Assistant Examiner* — Eric Gorman
(74) *Attorney, Agent, or Firm* — Burr & Brown, PLLC

(57) ABSTRACT

A vertical heat treatment apparatus including a furnace body having a heating section in the inner circumferential surface; a treatment container for housing a plurality of objects W to be treated. An air supply line is connected to the furnace body, and an air exhaust line is connected to the furnace body. An air supply blower and an air supply line valve mechanism, and an air exhaust blower and an air exhaust line valve mechanism are provided in the air supply line and the air exhaust line, respectively. A pressure detection system is provided for detecting the pressure in the space. A control section controls, based on a detection signal from the pressure detection system the blowers, the air supply line valve mechanism and the air exhaust line valve mechanism to keep the space at a slightly negative pressure.

16 Claims, 3 Drawing Sheets

(56) References Cited

U.S. PATENT DOCUMENTS

| | | |
|---|---|---|
| 7,727,780 B2 | 6/2010 | Sugishita et al. |
| 2002/0110769 A1* | 8/2002 | Yoshida et al. ............... 432/16 |
| 2002/0132480 A1* | 9/2002 | Shindo et al. ............... 438/689 |
| 2005/0271988 A1* | 12/2005 | Komai et al. ............... 431/5 |
| 2006/0280670 A1* | 12/2006 | Teeter et al. ............... 423/445 R |
| 2007/0282554 A1* | 12/2007 | Koyama et al. ............... 702/105 |
| 2008/0090389 A1* | 4/2008 | Wang et al. ............... 438/503 |
| 2008/0134977 A1* | 6/2008 | Nakashima et al. ............... 118/729 |
| 2008/0173238 A1* | 7/2008 | Nakashima et al. ............... 118/723 R |
| 2008/0182345 A1* | 7/2008 | Sugishita et al. ............... 438/7 |
| 2008/0318442 A1* | 12/2008 | Ogawa et al. ............... 438/785 |
| 2009/0029486 A1* | 1/2009 | Ueno et al. ............... 438/5 |
| 2009/0064765 A1* | 3/2009 | Megawa ............... 73/40.7 |
| 2009/0095422 A1 | 4/2009 | Sugishita et al. |
| 2009/0191718 A1* | 7/2009 | Nakashima et al. ............... 438/758 |
| 2009/0197352 A1* | 8/2009 | Ueno et al. ............... 438/5 |
| 2009/0197424 A1* | 8/2009 | Sakai et al. ............... 438/758 |
| 2009/0205783 A1* | 8/2009 | Tanabe et al. ............... 156/345.37 |
| 2009/0209095 A1* | 8/2009 | Horii ............... 438/585 |
| 2009/0233429 A1* | 9/2009 | Ishikawa et al. ............... 438/585 |
| 2009/0263971 A1* | 10/2009 | Tanabe ............... 438/694 |
| 2009/0269713 A1* | 10/2009 | Choi ............... 432/47 |
| 2009/0291566 A1* | 11/2009 | Ueno et al. ............... 438/758 |
| 2009/0308332 A1* | 12/2009 | Tanbour ............... 122/14.2 |
| 2010/0154711 A1* | 6/2010 | Ishibashi et al. ............... 118/725 |
| 2010/0218724 A1* | 9/2010 | Okada ............... 118/724 |
| 2011/0035165 A1* | 2/2011 | Koyama et al. ............... 702/45 |
| 2011/0220089 A1* | 9/2011 | Kobayashi ............... 126/77 |
| 2012/0052203 A1* | 3/2012 | Miyashita et al. ............... 427/248.1 |
| 2012/0086107 A1* | 4/2012 | Yamamoto et al. ............... 257/632 |
| 2012/0100722 A1* | 4/2012 | Asai et al. ............... 438/758 |
| 2012/0119337 A1* | 5/2012 | Sasaki et al. ............... 257/632 |
| 2012/0126355 A1* | 5/2012 | Mizuno et al. ............... 257/432 |
| 2012/0270169 A1* | 10/2012 | Yamaga ............... 432/49 |
| 2013/0042803 A1* | 2/2013 | Saido et al. ............... 117/88 |
| 2013/0065189 A1* | 3/2013 | Yoshii et al. ............... 432/9 |
| 2014/0206204 A1* | 7/2014 | Nakagawa ............... 438/795 |
| 2014/0256160 A1* | 9/2014 | Wada et al. ............... 438/786 |
| 2014/0287375 A1* | 9/2014 | Kosugi et al. ............... 432/233 |
| 2014/0295648 A1* | 10/2014 | Nakaiso et al. ............... 438/478 |

FOREIGN PATENT DOCUMENTS

| | | |
|---|---|---|
| JP | 2007-096334 A1 | 4/2007 |
| JP | 2008-205426 A1 | 9/2008 |
| JP | 2009-081415 A1 | 4/2009 |

* cited by examiner

VERTICAL HEAT TREATMENT APPARATUS AND METHOD FOR COOLING THE APPARATUS

CROSS-REFERENCE TO RELATED APPLICATIONS

This application claims priority to Japanese Patent Application No. 2010-053154, filed on Mar. 10, 2010, and Japanese Patent Application No. 2010-281622, filed on Dec. 17, 2010, the disclosures of which are incorporated herein by reference in their entirety.

BACKGROUND OF THE INVENTION

1. Field of the Invention

The present invention relates to a vertical heat treatment apparatus and a method for cooling the apparatus, and more particularly to a vertical heat treatment apparatus and a method for cooling the apparatus, which can cool the space between a furnace body and a treatment container with high precision.

2. Description of the Related Art

In the manufacturing of a semiconductor device, various types of vertical heat treatment apparatuses are used to perform various treatments, such as oxidation, diffusion, CVD (chemical vapor deposition), etc., of a semiconductor wafer as a processing object. A common vertical heat treatment apparatus comprises a heat treatment furnace including a treatment container for housing and heat treating a semiconductor wafer, and a furnace body, disposed such that it surrounds the treatment container, for heating the wafer in the treatment container. The furnace body includes a cylindrical heat insulator, and a heat generating resistor provided in the inner circumferential surface of the heat insulator via a support.

In the case of a heat treatment apparatus capable of batchwise treatment, for example, a spiral heater element (also called heater wire or heat generating resistor) disposed along the inner wall surface of a cylindrical heat insulator may be used as the above-described heat generating resistor. Such a heater element can heat the interior of a furnace at a high temperature, e.g. about 500 to 1000° C. A cylindrical ceramic insulator, obtained by firing a heat insulating material such as ceramic fibers, can be used as the above-described heat insulator. Such a heat insulator can reduce the amount of heat that may be lost through heat radiation or conduction, thus enhancing the efficiency of heating. The above-described support may be made of a ceramic material, and may support the heater element at a given pitch in such a manner as to allow thermal expansion and contraction of the heater element.

For the above-described vertical heat treatment apparatus, a method has been developed in which after heating a wafer at a high temperature, the space between the furnace body and the treatment container is rapidly cooled in order to streamline a heat treatment operation while maintaining the accuracy of heat treatment for the wafer.

In carrying out the rapid cooling method in the vertical heat treatment apparatus, when the pressure in the space between the furnace body and the treatment container is a positive pressure, hot air will blow out of the furnace body, which can cause breakage of the furnace body itself or its peripheral devices. When the pressure in the space between the furnace body and the treatment container is a highly negative pressure, on the other hand, the heat insulator of the furnace body can break. Further, the external air will enter the furnace body, which may result in a non-uniform temperature distribution in the interior of the treatment container and, in addition, can cause local breakage of the heat generating resistor.

It is, therefore, necessary to keep the space between the furnace body and the treatment container at a slightly negative pressure in carrying out the rapid cooling method in the vertical heat treatment apparatus. However, no method has yet been developed which can keep the space between the furnace body and the treatment container at a slightly negative pressure securely with high precision.

PATENT DOCUMENTS

Patent document 1: Japanese Patent Laid-Open Publication No. 2002-305189
Patent document 2: Japanese Patent Laid-Open Publication No. 2008-205426
Patent document 3: Japanese Patent Laid-Open Publication No. 2009-81415

SUMMARY OF THE INVENTION

The present invention has been made in view of the above situation. It is therefore an object of the present invention to provide a vertical heat treatment apparatus and a method for cooling the apparatus, which can rapidly cool the space between a furnace body and a treatment container while controlling the pressure in the space at a slightly negative pressure with high precision.

In order to achieve the object, the present invention provides a vertical heat treatment apparatus comprising: a furnace body having a heating section in the inner circumferential surface; a treatment container for housing a plurality of objects to be treated and which is disposed in the furnace body and defines a space between it and the furnace body; a plurality of air outlets provided in an air outlet formation area of the furnace body; an air supply line, connected to the furnace body, for supplying cooling air to the space via the plurality of air outlets; an air exhaust line, connected to the furnace body, for exhausting the cooling air from the space; a blower provided in at least one of the air supply line and the air exhaust line; an air supply line valve mechanism and an air exhaust line valve mechanism provided in the air supply line and the air exhaust line, respectively; a pressure detection system for detecting the pressure in the space between the furnace body and the treatment container; and a control section for controlling, based on a detection signal from the pressure detection system, at least one of the blower, the air supply line valve mechanism and the air exhaust line valve mechanism to keep the space at a slightly negative pressure, wherein the pressure detection system is provided in a space area, corresponding to the air outlet formation area, of the space between the furnace body and the treatment container.

In the heat treatment apparatus, the slightly negative pressure in the space may be in the range of 0 Pa to −85 Pa.

In the heat treatment apparatus, the slightly negative pressure in the space is preferably in the range of −20 Pa to −30 Pa.

In the heat treatment apparatus, the air supply line and the air exhaust line are connected to each other and constitute a closed air supply/air exhaust line system, and the blower is provided for air supply and air exhaust in the closed air supply/air exhaust line system.

In the heat treatment apparatus, the air supply line and the air exhaust line are provided independently of each other and constitute an open air supply/air exhaust line system, and the blower includes an air supply blower provided in the air supply line and an air exhaust blower provided in the air exhaust line.

In the heat treatment apparatus, the control section, based on a detection signal from the pressure detection system, may control the rotational speed of the blower to keep the space at a slightly negative pressure.

In the heat treatment apparatus, the control section, based on a detection signal from the pressure detection system, may adjust the valve opening degree of the air supply line valve mechanism or the air exhaust line valve mechanism to keep the space at a slightly negative pressure.

In the heat treatment apparatus, the pressure detection system includes a pressure detector tube that penetrates through the furnace body, and a pressure sensor provided at the outlet of the pressure detector tube.

The present invention also provides a method for cooling a vertical heat treatment apparatus comprising: a furnace body having a heating section in the inner circumferential surface; a treatment container for housing a plurality of objects to be treated and which is disposed in the furnace body and defines a space between it and the furnace body; a plurality of air outlets provided in an air outlet formation area of the furnace body; an air supply line, connected to the furnace body, for supplying cooling air to the space via the plurality of air outlets; an air exhaust line, connected to the furnace body, for exhausting the cooling air from the space; a blower provided in at least one of the air supply line and the air exhaust line; an air supply line valve mechanism and an air exhaust line valve mechanism provided in the air supply line and the air exhaust line, respectively; a pressure detection system for detecting the pressure in the space between the furnace body and the treatment container; and a control section for controlling, based on a detection signal from the pressure detection system, at least one of the blower, the air supply line valve mechanism and the air exhaust line valve mechanism to keep the space at a slightly negative pressure, wherein the pressure detection system is provided in a space area, corresponding to the air outlet formation area, of the space between the furnace body and the treatment container, said method comprising: a first cooling step of supplying cooling air to the space between the furnace body and the treatment container through the air supply line and exhausting the cooling air from the space through the air exhaust line by actuating the blower with the control section; and a second cooling step of controlling, based on a detection signal from the pressure detection system which indicates a decrease in the pressure in the space from that in the first cooling step due to decrease in the temperature of the space, at least one of the blower, the air supply line valve mechanism and the air exhaust line valve mechanism with the control section to supply a larger amount of cooling air than that in the first cooling step to the space.

In the method, the space may be kept at a slightly negative pressure in the range of 0 Pa to −85 Pa.

In the method, the space is kept at a slightly negative pressure in the range of −20 Pa to −30 Pa.

In the method, the air supply line and the air exhaust line are connected to each other and constitute a closed air supply/air exhaust line system, and the blower is provided for air supply and air exhaust in the closed air supply/air exhaust line system.

In the method, the air supply line and the air exhaust line are provided independently of each other and constitute an open air supply/air exhaust line system, and the blower includes an air supply blower provided in the air supply line and an air exhaust blower provided in the air exhaust line.

In the method, the control section, based on a detection signal from the pressure detection system, may control the rotating speed of the blower to keep the space at a slightly negative pressure.

In the method, the control section, based on a detection signal from the pressure detection system, may adjust the valve opening degree of the air supply line valve mechanism or the air exhaust line valve mechanism to keep the space at a slightly negative pressure.

In the method, the pressure detection system includes a pressure detector tube that penetrates through the furnace body, and a pressure sensor provided at the outlet of the pressure detector tube.

According to the present invention, the space between the furnace body and the treatment container can be directly detected with the pressure detection system. This makes it possible to forcibly cool the space while accurately keeping the space at a slightly negative pressure. The pressure in the space can thus be prevented from becoming a positive pressure, whereby hot air can be prevented from blowing out of the furnace body. Further, the pressure in the space can be prevented from becoming a highly negative pressure. This can prevent the external air from entering the furnace body.

DETAILED DESCRIPTION OF THE INVENTION

First Embodiment

Figure 1:
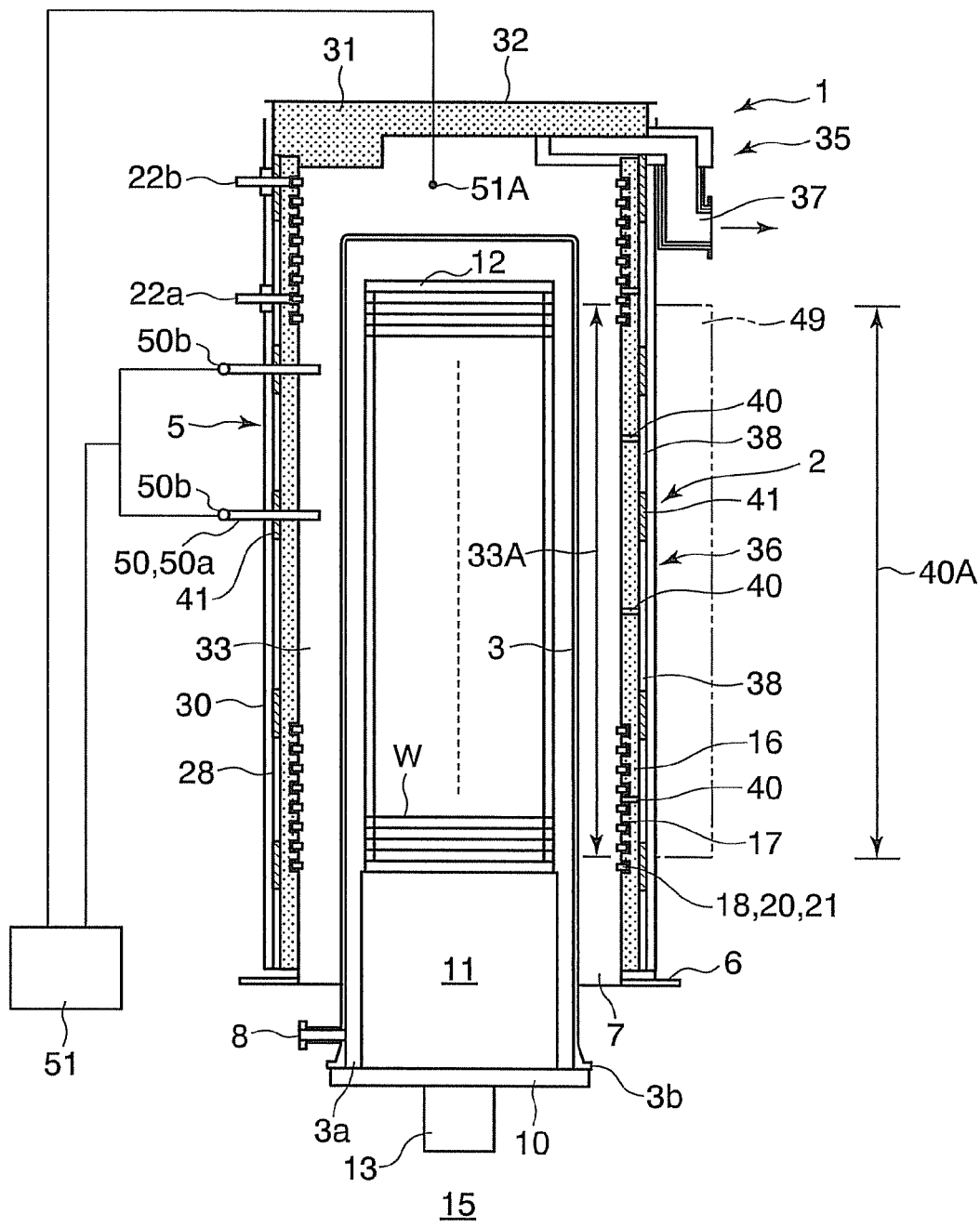
FIG. 1 is a vertical sectional view schematically showing a vertical heat treatment apparatus according to the present invention.
Figure 2:
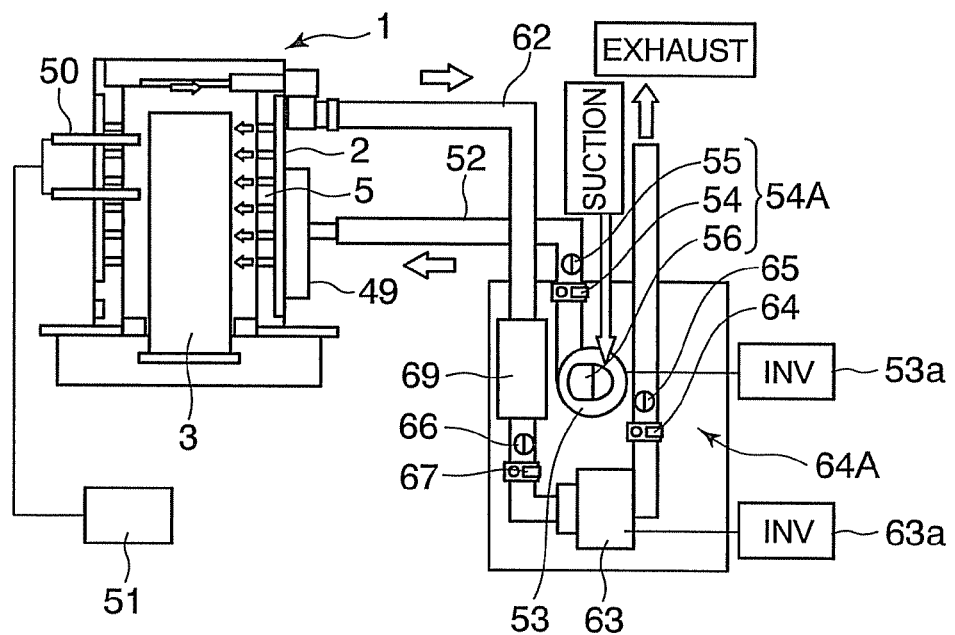
FIG. 2 is a diagram showing an exemplary air supply line/air exhaust line system of the vertical heat treatment apparatus.
Figure 3:
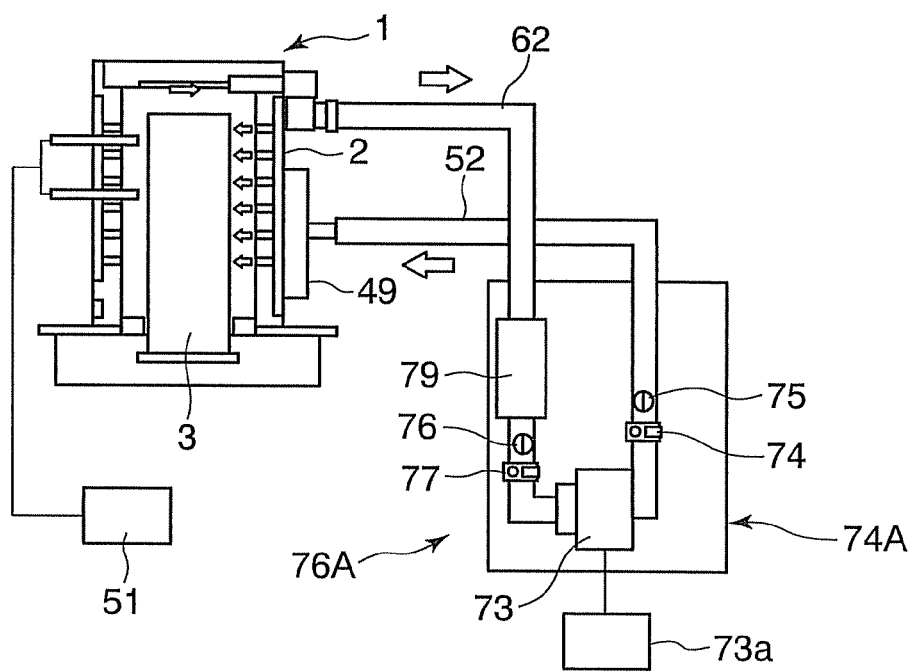
FIG. 3 is a diagram showing another exemplary air supply line/air exhaust line system of the vertical heat treatment apparatus.

A first embodiment of the present invention will now be described with reference to the drawings. FIG. 1 is a vertical sectional view schematically showing a vertical heat treatment apparatus according to the present invention, FIG. 2 is a diagram showing an exemplary air supply line/air exhaust line system of the vertical heat treatment apparatus, and FIG. 3 is a diagram showing another exemplary air supply line/air exhaust line system of the vertical heat treatment apparatus.

Referring to FIG. 1, the vertical heat treatment apparatus 1 includes a vertical heat treatment furnace 2 which is capable of housing a large number of processing objects, e.g. semiconductor wafers W, and performing heat treatment such as oxidation, diffusion, low-pressure CVD, etc. The heat treatment furnace 2 includes a furnace body 5 having, in its inner circumferential surface, a heat generating resistor (heating section), and a treatment container 3 for housing and heat treating the wafers W and which is disposed in the furnace body 5 and defines a space 33 between it and the furnace body 5.

The furnace body 5 is supported on a base plate 6 which has an opening 7 for inserting the treatment container 3 from below. The opening 7 is provided with a not-shown heat insulator to cover the gap between the base plate 6 and the treatment container 3.

The treatment container 3 is made of quartz and has a vertically long cylindrical shape with the upper end closed and the lower end open as a furnace opening 3a. An outwardly extending flange 3b is formed at the lower end of the treatment container 3. The flange 3b is supported on the base plate 6 via a not-shown flange presser. The treatment vessel 3 has in its lower side portion an introduction port 8 for introducing e.g. a treatment gas or an inert gas into the treatment container 3, and a not-shown exhaust port for exhausting a gas from the treatment container 3. The introduction port 8 is connected to a gas supply source (not shown), and the exhaust port is connected to a vacuum system (not shown) including a vacuum pump capable of controllably depressurizing the treatment container 3 e.g. to about $133 \times 10$ Pa to $133 \times 10^{-8}$ Pa.

Below the treatment container 3 is provided a lid 10 for closing the furnace opening 3a of the treatment container 3 and which can be moved vertically by means of a not-shown lifting mechanism. A heat-retaining cylinder 11 as a heat-retaining means for the furnace opening is placed on the upper surface of the lid 10, and a quartz boat 12 as a retainer for holding a large number, e.g. about 100 to 150, of 300-mm semiconductor wafers W at a predetermined spacing in the vertical direction, is placed on the upper surface of the heat-retaining cylinder 11. The lid 10 is provided with a rotating mechanism 13 for rotating the boat 12 on its axis. The boat 12 is carried (unloaded) from the treatment container 3 downward into a loading area 15 by the downward movement of the lid 10 and, after replacement of wafers W, carried (loaded) into the treatment container 3 by the upward movement of the lid 10.

The furnace body 5 includes a cylindrical heat insulator 16, groove-like shelf portions 17 formed in the inner circumferential surface of the heat insulator 16 and arranged in multiple stages in the axial direction (vertical direction in FIG. 1), and heater elements (heater wires, heat generating resistors) 18 disposed along each shelf portion 17. The heat insulator 16 is composed of inorganic fibers, such as silica, alumina or alumina silicate. The heat insulator 16 is longitudinally halved to facilitate installation of the heater elements and assembly of the heater.

The heater element 18 has a corrugated shape obtained by shaping (bending) of a strip-shaped heat generating resistor. The corrugated heater element 18 is composed of, for example, an alloy (Kanthal alloy) consisting of iron (Fe), chromium (Cr) and aluminum (Al). The heater element 18 has, for example, a thickness of about 1 to 2 mm, a width of about 14 to 18 mm, a corrugation amplitude of about 11 to 15 mm and a corrugation pitch P of about 28 to 32 mm. In order to allow some degree of circumferential movement of the heater element 18 on each shelf portion 17 of the heat insulator 16 and to enhance the strength of the bent portions of the heater element 18, it is preferred that the apex angle θ of each apex portion (top portion or peak portion) of the corrugated heater element 18 be made about 90 degrees and that the apex portions have been subjected to R-bending.

The heat insulator 16 is provided with pin members 20 for holding the heater elements 18 at predetermined intervals in such a manner as to allow radial movement of the heater elements 18 and to prevent fall or escape of the heater elements 18 from the shelf portions 17. In the inner circumferential surface of the cylindrical heat insulator 16, annular grooves 21, concentric with the heat insulator 16, are formed in multiple stages at a predetermined pitch in the axial direction, with the circumferentially-continuous annular shelf portion 17 being formed between adjacent upper and lower grooves 21. A gap sufficient to permit thermal expansion/contraction and radial movement of the heater element 18 is provided over and under the heater element 18 in the groove portion 21 and between the bottom wall of the groove portion 21 and the heater element 18. Upon forced air cooling of the heat treatment apparatus, such gaps allow cooling air to enter the space behind the heater element 18, enabling effective cooling of the heater element 18.

The heater elements 18 are connected by a connecting plate, and the heater elements 18 positioned on the terminal side are connected to an external power source via terminal plates 22a, 22b that penetrate radially through the heat insulator 16.

As shown in FIG. 1, the outer circumferential surface of the heat insulator 16 of the furnace body 5 is covered with an outer shell 28 made of a metal, such as stainless steel, in order to retain the shape of the heat insulator 16 and, in addition, to reinforce the heat insulator 16. The outer circumferential surface of the outer shell 28 is covered with a water-cooling jacket 30 in order to reduce the thermal influence of the furnace body 5 on the external environment. An upper heat insulator 31 which covers the top (upper end) of the heat insulator 16 is provided on the top of the heat insulator 16, and a stainless steel top board 32 which covers the top (upper end) of the outer shell 28 is provided on the upper surface of the upper insulator 31.

As shown in FIGS. 1 and 2, in order to rapidly lower the temperature of a wafer after heat treatment so as to speed up the process and increase the throughput, the furnace body 5 is provided with a heat exhaust system 35 for discharging the atmosphere in the space 33 between the furnace body 5 and the treatment container 3 to the outside, and a forced air cooling means 36 for introducing air at room temperature (20-30° C.) into the space 33 to forcibly cool the space 33. The heat exhaust system 35 is comprised of an exhaust port 37 provided e.g. at the top of the furnace body 5, and to the exhaust port 37 is connected an air exhaust line 62 for exhausting air from the space 33.

The forced air cooling means 36 includes a plurality of annular flow passages 38 formed between the heat insulator 16 and the outer shell 28 and arranged in the height direction of the furnace body 5, and a plurality of forced cooling air outlets 40, provided in the heat insulator 16, for ejecting air from the respective annular flow passages 38 in a direction oblique to the radial direction of the heat insulator 16 to create a swirling flow in the circumferential direction of the space 33. The annular flow passages 38 are formed by attaching band-like or annular heat insulators 41 to the outer circumferential surface of the heat insulator 16, or by annularly grinding the outer circumferential surface of the heat insulator 16. Each forced cooling air outlet 40 is formed in the shelf portion 17, lying between adjacent upper and lower heater elements 18 in the heat insulator 16, such that it penetrates through the shelf portion 17. By thus providing the forced cooling air outlets 40 in the shelf portions 17, air can be ejected into the space 33 without being impeded by the heater elements 18.

Though in this embodiment a corrugated heater element, obtained by bending of a strip-shaped heat generating resistor, is used as the heater element 18, and the corrugated heater element 18 is housed in each shelf portion 17, it is possible to use other types of heater elements having various structures. Though in this embodiment air is ejected from the forced cooling air outlets 40 in such a manner as to create a swirling flow, the creation of a swirling air flow is not always necessary.

A common supply duct 49 for distributing and supplying cooling air to the annular flow passages 38 and which extends in the height direction of the furnace body 5, is provided on the outer circumferential surface of the outer shell 28. The outer shell 28 has communication holes for communication between the supply duct 49 and the annular flow passages 38.

To the supply duct 49 is connected an air supply line 52 for sucking in air in a clean room as cooling air (20-30° C.) and supplying the cooling air.

Because the forced cooling air outlets 40 are each formed in a shelf portion 17, lying between adjacent upper and lower heater elements 18 in the heat insulator 16, such that it penetrates through the shelf portion 17, as described above, air can be easily ejected from the outlets 40 without being impeded by the heater elements 18. The heat insulator 16 is longitudinally halved, and accordingly the heater elements 18 are also longitudinally halved. This can facilitate installation of the heater elements 18 in the heat insulator 16, enabling easy assembly of the heater.

As shown in FIGS. 1 and 2, the furnace body 5 is provided with a pressure detection system 50 penetrating through the heat insulator 16, the outer shell 28 and the cooling jacket 30 of the furnace body 5. The pressure detection system 50 includes a pressure detector tube 50a penetrating and extending through the heat insulator 16, the outer shell 28 and the cooling jacket 30, and a pressure sensor 50b provided at the outlet of the pressure detector tube 50a, and detects the pressure in the space 33 between the furnace body 5 and the treatment container 3.

When the pressure in the space 33 between the furnace body 5 and the treatment container 3 is detected by the pressure sensor 50b of the pressure detection system 50, the detection signal from the pressure sensor 50b is sent to a control section 51.

Further, a temperature sensor 51A for detecting the temperature of the space 33 between the furnace body 5 and the treatment container 3 is disposed in the space 33. Based on a detection signal from the temperature sensor 51A, control of heat treatment in the vertical heat treatment apparatus is performed by the control section 51.

As shown in FIG. 2, the air supply line 52 and the air exhaust line 62, independent of each other, constitute an open air supply/exhaust line system. The air supply line 52 of the system is provided with an air supply blower 53 having an inverter drive unit 53a.

A damper 56 is provided on the inlet side of the air supply blower 53, and a hole valve 54 and a butterfly valve 55 are disposed on the outlet side of the air supply blower 53. For each of the damper 56 on the inlet side of the air supply blower 53, and the hole valve 54 and the butterfly valve 55 on the outlet side of the air supply blower 53, the opening/closing is adjustable. The damper 56, the hole valve 54 and the butterfly valve 55 constitute an air supply line valve mechanism 54A.

On the other hand, the air exhaust line 62 is provided with an air exhaust blower 63 having an inverter drive unit 63a.

A butterfly valve 66 and a hole valve 67 are provided on the inlet side of the air exhaust blower 63, and a hole valve 64 and a butterfly valve 65 are disposed on the outlet side of the air exhaust blower 63. For each of the butterfly valve 66 and the hole valve 67 on the inlet side of the air exhaust blower 63, and the hole valve 64 and the butterfly valve 65 on the outlet side of the air exhaust blower 63, the opening/closing is adjustable. The butterfly valve 66 and the hole valve 67 on the inlet side of the air exhaust blower 63, and the hole valve 64 and the butterfly valve 65 on the outlet side of the air exhaust blower 63 constitute an air exhaust line valve mechanism 64A.

The above-described forced cooling air outlets 40 are formed over the entire length of the supply duct 49, ranging from the upper end to the lower end of the supply duct 49. Thus, the area 40A in which the air outlets 40 are formed coincides with the entire length of the supply duct 49.

The pressure detection system 50 is provided in a space area 33A corresponding to the air outlet formation area 40A. This enables direct detection of the pressure in the space area 33A which is affected by air ejected from the air outlets 40.

The operation of the vertical heat treatment apparatus having the above construction will now be described.

First, wafers W are loaded into the boat 12, and the boat 12 loaded with the wafers W is placed on the heat-retaining cylinder 11 on the lid 10. Thereafter, the boat 12 is carried into the treatment container 3 by the upward movement of the lid 10.

Next, the control section 51 actuates the heater elements 18 though control of the power source to heat the space 33 between the furnace body 5 and the treatment container 3 and carry out heat treatment of the wafers W in the boat 12 in the treatment container 3.

During the heat treatment, the control section 51 controls the treatment temperature based on a detection signal from the temperature sensor 51A so that the heat treatment of the wafers W can be performed with high precision at an appropriate temperature.

After completion of the heat treatment, the space 33 between the furnace body 5 and the treatment container 3 is forcibly cooled in order to streamline the heat treatment operation.

A method for forcibly cooling the space 33 will now be described.

First, the air supply blower 53 and the air exhaust blower 63 are actuated by the control section 51. Cooing air (20-30° C.) in the clean room is introduced into the air supply line 52, and the cooling air is fed from the air supply blower 53 to the supply duct 49.

The cooling air in the supply duct 49 then enters the annular flow passages 38 formed on the outer circumferential surface of the heat insulator 16 of the furnace body 5, and the cooling air in the annular flow passages 38 is then ejected from the air outlets 40, penetrating through the heat insulator 16, into the space 33 between the furnace body 5 and the treatment container 3 to forcibly cool the space 33 (first cooling step).

Heated air in the space 33 is fed through the air exhaust line 62 to a heat converter 69 where the air is cooled, and the cooled air is discharged by the air exhaust blower 63 to the outside.

Figure 4:
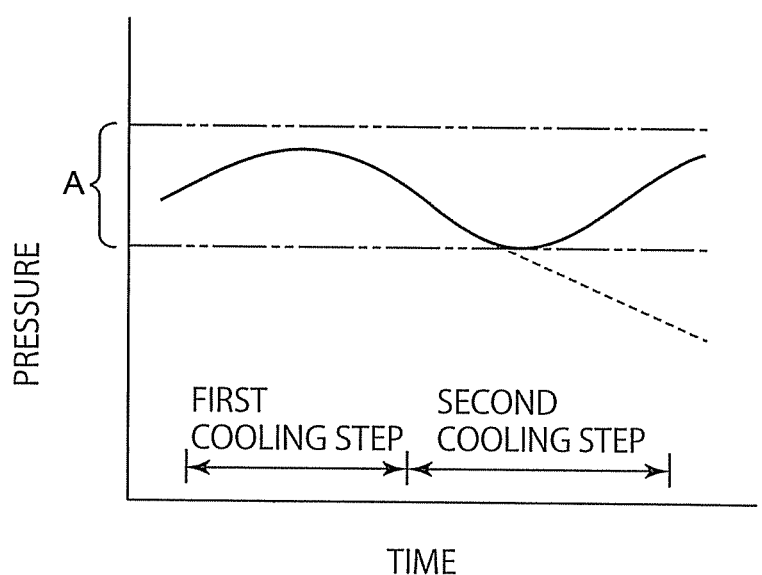
FIG. 4 is a diagram illustrating a method for cooling the vertical heat treatment apparatus.

During the above operation, the control section 51 drives and controls the inverter drive unit 53a of the air supply blower 53 and the inverter drive unit 63a of the air exhaust blower 63 and, in addition, drives and controls the air supply line valve mechanism 54A and the air exhaust line valve mechanism 64A so as to maintain the pressure in the space 33 in a slightly negative pressure range A [0 Pa to −85 Pa, preferably −20 Pa to −30 Pa relative to the external environment (atmospheric pressure) of the furnace body 5] (see FIG. 4).

By maintaining the pressure in the space 33 in the slightly negative pressure range A, i.e. 0 Pa to −85 Pa, preferably −20 Pa to −30 Pa relative to the external environment (atmospheric pressure) of the furnace body 5, the pressure in the space 33 can be prevented from becoming a positive pressure, whereby hot air can be prevented from blowing out of the furnace body 5. Further, the pressure in the space 33 can be prevented from becoming a highly negative pressure. This can prevent the external air from entering the furnace body 5 and making the temperature distribution in the interior of the treatment container 3 non-uniform.

After the space 33 between the furnace body 5 and the treatment container 3 is forcibly cooled in the first cooling step, the temperature of the space 33 decreases and the pressure in the space 33 becomes lower than that in the first cooling step.

The pressure in the space 33 is directly and continually detected with the pressure detection system 50. When the pressure in the space 33 has become significantly lower than that in the first cooling step, the control section 51, based on a detection signal from the pressure detection system 50 which indicates the pressure decrease, sets a higher pressure than the pressure set for the first cooling step, and drives and controls the inverter drive unit 53a of the air supply blower 53 and the inverter drive unit 63a of the air exhaust blower 63 and, in addition, drives and controls the air supply line valve mechanism 54A and the air exhaust line valve mechanism 64A. In this case, a larger amount of cooling air than that in the first cooling step is supplied from the air supply line 52 to the space 33, so that the pressure in the space 33 can be returned to that in the first cooling step (second cooling step). If the second cooling step is not carried out, the pressure will continue to decrease as shown by the broken line in FIG. 4. By carrying out the second cooling step, the pressure in the space 33 can be returned to the pressure level in the first cooling step, as shown by the solid line in FIG. 4.

The second cooling step can prevent the external air from entering the furnace body 5 due to decrease in the pressure in the space 33. Furthermore, a larger amount of air can be supplied to the space 33 as compared to the first cooling step, making it possible to forcibly cool the space 33 rapidly and securely.

The operation of the vertical heat treatment apparatus in the first cooling step and the second cooling step will now be described in more detail.

As described above, in the first cooling step, cooling air in the annular flow passages 38 is ejected from the air outlets 40, penetrating through the heat insulator 16, into the space 33 between the furnace body 5 and the treatment container 3 to forcibly cool the space 33. The cooling air ejected into the space 33, while cooling the heater elements 18 of the furnace body 5 and the treatment container 3, rapidly expands and increases its volume and pressure (see FIG. 4). As described above, the pressure detection system 50 is provided in the space 33 between the furnace body 5 and the treatment container 3, and the pressure in the space 33 is directly detected by the pressure detection system 50. Compared to the case where a pressure sensor is provided at a distance from the space 33, for example, in the air supply line 52 or the air discharge line 62, the pressure detection system 50 can quickly and accurately detect the increase in the pressure in the space 33 without being affected by an external disturbance. Based on a detection signal from the pressure detection system 50, the control section 51 performs control in an appropriate manner so that the space 33 is kept at the above-described slightly negative pressure.

In this regard, it may be possible to detect the pressure in the space 33 with a pressure sensor provided in the air supply line 52 or the air discharge line 62. In the case of a sensor provided in the air supply line 52, however, a pressure applied to cooling air must be taken into consideration as an external disturbance. In the case of a sensor provided in the air exhaust line 62, a suction pressure applied to cooling air must be taken into consideration as an external disturbance.

According to the present invention, on the other hand, because of the provision of the pressure detection system 50 in the space 33 between the furnace body 5 and the treatment container 3, the pressure increase in the space 33 can be detected directly, quickly and accurately without being affected by an external disturbance. This enables the control section 51 to perform control in an appropriate manner to keep the space at a slightly negative pressure.

After the space 33 between the furnace body 5 and the treatment container 3 is forcibly cooled in the first cooling step, the temperature of the space 33 decreases and the pressure in the space 33 also decreases (second cooling step) as shown in FIG. 4.

The pressure in the space 33 is directly and continually detected with the pressure detection system 50 also after the first cooling step, and the decrease in the pressure in the space 33 can be detected quickly and accurately. Based on a detection signal from the pressure detection system 50 which indicates the decrease in the pressure, the control section 51 controls the apparatus in such a manner as to supply a larger amount of cooling air than that in the first cooling step from the air supply line 52 to the space 33, whereby the pressure in the space 33 can be returned to the pressure in the first cooling step.

By thus supplying in the second cooling step a larger amount of cooling air than that in the first cooling step and thereby raising the pressure in the space 33, an excessive lowering of the cooling rate can be avoided in the second cooling step.

Though in this embodiment the control section 51, based on a detection signal from the pressure detection system 50, drives and controls the inverter drive unit 53a of the air supply blower 53, the inverter drive unit 63a of the air exhaust blower 63, the air supply line valve mechanism 54A and the air exhaust line valve mechanism 64A, it is also possible for the control section 51 to drive and control either one or a combination of the inverter drive unit 53a of the air supply blower 53, the inverter drive unit 63a of the air exhaust blower 63, the air supply line valve mechanism 54A and the air exhaust line valve mechanism 64A. Further, the control section 51 may drive and control only one of the members 54, 55 and 56 of the air supply line valve mechanism 54A, or drive and control only one of the members 64, 65, 66 and 67 of the air exhaust line valve mechanism 64A.

Second Embodiment

A second embodiment of the present invention will now be described with reference to FIGS. 1 and 3.

As shown in FIGS. 1 and 3, the air supply line 52 and the air discharge line 62 are connected to each other, constituting a closed air supply/exhaust line system. A blower 73 for air supply and air exhaust, having an inverter drive unit 73a, is provided at the connection between the air supply line 52 and the air discharge line 62.

A butterfly valve 76 and a hole valve 77 are provided on the inlet side of the blower 73, and a hole valve 74 and a butterfly valve 75 are disposed on the outlet side of the blower 73. For each of the butterfly valve 76 and the hole valve 77 on the inlet side of the blower 73, and the hole valve 74 and the butterfly valve 75 on the outlet side of the blower 73, the opening/closing is adjustable. The hole valve 74 and the butterfly valve 75 on the air supply line 52 side constitute an air supply line valve mechanism 74A.

On the other hand, the butterfly valve 76 and the hole valve 77 on the air exhaust line 62 side constitute an air exhaust line valve mechanism 76A.

The operation of the vertical heat treatment apparatus having the above construction will now be described.

First, wafers W are loaded into the boat 12, and the boat 12 loaded with the wafers W is placed on the heat-retaining cylinder 11 on the lid 10. Thereafter, the boat 12 is carried into the treatment container 3 by the upward movement of the lid 10.

Next, the control section 51 actuates the heater elements 18 though control of the power source to heat the space 33 between the furnace body 5 and the treatment container 3 and carry out heat treatment of the wafers W in the boat 12 in the treatment container 3.

During the heat treatment, the control section 51 controls the treatment temperature based on a detection signal from the temperature sensor 51A so that the heat treatment of the wafers W can be performed with high precision at an appropriate temperature.

After completion of the heat treatment, the space 33 between the furnace body 5 and the treatment container 3 is forcibly cooled in order to streamline the heat treatment operation.

A method for forcibly cooling the space 33 will now be described.

First, the air supply/air exhaust blower 73 is actuated by the control section 51, whereby cooing air in the air supply line 52 is fed to the supply duct 49.

The cooling air in the supply duct 49 then enters the annular flow passages 38 formed on the outer circumferential surface of the heat insulator 16 of the furnace body 5, and the cooling air in the annular flow passages 38 is then ejected from the air outlets 40, penetrating through the heat insulator 16, into the space 33 between the furnace body 5 and the treatment container 3 to forcibly cool the space 33 (first cooling step).

Heated air in the space 33 is fed through the air exhaust line 62 to a heat exchanger 79 where the air is cooled, and the cooled air is returned to the blower 73.

During the above operation, the control section 51 drives and controls the inverter drive unit 73a of the blower 73 and, in addition, drives and controls the air supply line valve mechanism 74A and the air exhaust line valve mechanism 76A so as to maintain the pressure in the space 33 in a slightly negative pressure range A [0 Pa to −85 Pa, preferably −20 Pa to −30 Pa relative to the external environment (atmospheric pressure) of the furnace body 5] (see FIG. 4).

By maintaining the pressure in the space 33 in the slightly negative pressure range A, i.e. 0 Pa to −85 Pa, preferably −20 Pa to −30 Pa relative to the external environment (atmospheric pressure) of the furnace body 5, the pressure in the space 33 can be prevented from becoming a positive pressure, whereby hot air can be prevented from blowing out of the furnace body 5. Further, the pressure in the space 33 can be prevented from becoming a highly negative pressure. This can prevent the external air from entering the furnace body 5 and making the temperature distribution in the interior of the treatment container 3 non-uniform.

After the space 33 between the furnace body 5 and the treatment container 3 is forcibly cooled in the first cooling step, the temperature of the space 33 decreases and the pressure in the space 33 becomes lower than that during the first cooling step.

The pressure in the space 33 is directly and continually detected with the pressure detection system 50. When the pressure in the space 33 has become significantly lower than that during the first cooling step, the control section 51, based on a detection signal from the pressure detection system 50 which indicates the pressure decrease, sets a higher pressure than the pressure set for the first cooling step, and drives and controls the inverter drive unit 73a of the blower 73 and, in addition, drives and controls the air supply line valve mechanism 74A and the air exhaust line valve mechanism 76A. In this case, a larger amount of cooling air than that in the first cooling step is supplied from the air supply line 52 to the space 33, so that the pressure in the space 33 can be returned to that during the first cooling step (second cooling step). If the second cooling step is not carried out, the pressure will continue to decrease as shown by the broken line in FIG. 4. By carrying out the second cooling step, the pressure in the space 33 can be returned to the pressure level in the first cooling step, as shown by the solid line in FIG. 4.

The second cooling step can prevent the external air from entering the furnace body 5 due to decrease in the pressure in the space 33. Furthermore, a larger amount of air can be supplied to the space 33 as compared to the first cooling step, making it possible to forcibly cool the space 33 rapidly and securely.

The operation of the vertical heat treatment apparatus in the first cooling step and the second cooling step will now be described in more detail.

As described above, in the first cooling step, cooling air in the annular flow passages 38 is ejected from the air outlets 40, penetrating through the heat insulator 16, into the space 33 between the furnace body 5 and the treatment container 3 to forcibly cool the space 33. The cooling air ejected into the space 33, while cooling the heater elements 18 of the furnace body 5 and the treatment container 3, rapidly expands and increases its volume and pressure (see FIG. 4). As described above, the pressure detection system 50 is provided in the space 33 between the furnace body 5 and the treatment container 3, and the pressure in the space is directly detected by the pressure detection system 50. Compared to the case where a pressure sensor is provided at a distance from the space 33, for example, in the air supply line 52 or the air discharge line 62, the pressure detection system 50 can quickly and accurately detect the increase in the pressure in the space 33 without being affected by an external disturbance. Based on a detection signal from the pressure detection system 50, the control section 51 performs control in an appropriate manner so that the space 33 is kept at the above-described slightly negative pressure.

In this regard, it is possible to detect the pressure in the space 33 with a pressure sensor provided in the air supply line 52 or the air discharge line 62. In the case of a sensor provided in the air supply line 52, a pressure applied to cooling air must be taken into consideration as an external disturbance. In the case of a sensor provided in the air exhaust line 62, a suction pressure applied to cooling air must be taken into consideration as an external disturbance.

According to the present invention, on the other hand, because of the provision of the pressure detection system 50 in the space 33 between the furnace body 5 and the treatment container 3, the pressure increase in the space 33 can be detected directly, quickly and accurately without being affected by an external disturbance. This enables the control section 51 to perform control in an appropriate manner to keep the space at a slightly negative pressure.

After the space 33 between the furnace body 5 and the treatment container 3 is forcibly cooled in the first cooling step, the temperature of the space 33 decreases and the pressure in the space 33 also decreases (second cooling step) as shown in FIG. 4.

The pressure in the space 33 is directly and continually detected with the pressure detection system 50 also after the first cooling step, and the decrease in the pressure in the space 33 can be detected quickly and accurately. Based on a detection signal from the pressure detection system 50 which indicates the decrease in the pressure, the control section 51 controls the apparatus in such a manner as to supply a larger amount of cooling air than that in the first cooling step from the air supply line 52 to the space 33, whereby the pressure in the space 33 can be returned to the pressure in the first cooling step.

By thus supplying in the second cooling step a larger amount of cooling air than that in the first cooling step and thereby raising the pressure in the space 33, an excessive lowering of the cooling rate can be avoided in the second cooling step.

Though in this embodiment the control section 51, based on a detection signal from the pressure detection system 50, drives and controls the inverter drive unit 73a of the air supply/air exhaust blower 73, the air supply line valve mechanism 74A and the air exhaust line valve mechanism 76A, it is also possible for the control section 51 to drive and control either one or a combination of the inverter drive unit 73a of the air supply/air exhaust, blower 73, the air supply line valve mechanism 74A and the air exhaust line valve mechanism 76A. Further, the control section 51 may drive and control only one of the members 74 and 75 of the air supply line valve mechanism 74A, or drive and control only one of the members 76 and 77 of the air exhaust line valve mechanism 76A.

While the present invention has been described with reference to preferred embodiments, it is understood that the present invention is not limited to the embodiments described above, but is capable of various changes and modifications within the scope of the inventive concept as expressed herein. For example, it is possible to use a treatment container with a cylindrical manifold, made of a heat-resistant metal such as stainless steel and including an introduction pipe portion and an exhaust pipe portion, coupled to the lower end, or to use a treatment container having a double-pipe structure.

What is claimed is:

1. A vertical heat treatment apparatus comprising:
   a furnace body having a heating section in the inner circumferential surface;
   a treatment container for housing a plurality of objects to be treated and which is disposed in the furnace body and defines a space between it and the furnace body;
   a plurality of air outlets provided in a vertical direction in an air outlet formation area of the furnace body;
   an air supply line, connected to the furnace body, for supplying a cooling air to the space via the plurality of air outlets;
   an air exhaust line, connected to the furnace body, for exhausting the cooling air from the space;
   a blower provided in at least one of the air supply line and the air exhaust line;
   an air supply line valve mechanism and an air exhaust line valve mechanism provided in the air supply line and the air exhaust line, respectively;
   a pressure detection system for detecting the pressure in the space between the furnace body and the treatment container; and
   a control section for controlling, based on a detection signal from the pressure detection system, at least one of the blower provided in at least one of the air supply line and the air exhaust line, the air supply line valve mechanism and the air exhaust line valve mechanism to keep the space at a slightly negative pressure, wherein the air outlet formation area is formed in the vertical direction in the furnace body by the plurality of air outlets, and the pressure detection system is provided in a space area that is formed in the vertical direction in the furnace body, corresponding to the air outlet formation area, of the space between the furnace body and the treatment container.

2. The vertical heat treatment apparatus according to claim 1, wherein the slightly negative pressure in the space is in the range of 0 Pa to −85 Pa.

3. The vertical heat treatment apparatus according to claim 2, wherein the slightly negative pressure in the space is in the range of −20 Pa to −30 Pa.

4. The vertical heat treatment apparatus according to claim 1, wherein the air supply line and the air exhaust line are connected to each other and constitute a closed air supply/air exhaust line system, and the blower is provided for air supply and air exhaust in the closed air supply/air exhaust line system.

5. The vertical heat treatment apparatus according to claim 1, wherein the air supply line and the air exhaust line are provided independently of each other and constitute an open air supply/air exhaust line system, and the blower includes an air supply blower provided in the air supply line and an air exhaust blower provided in the air exhaust line.

6. The vertical heat treatment apparatus according to claim 1, wherein the control section, based on the detection signal from the pressure detection system, controls the rotational speed of the blower provided in at least one of the air supply line and the air exhaust line to keep the space at the slightly negative pressure.

7. The vertical heat treatment apparatus according to claim 1, wherein the control section, based on the detection signal from the pressure detection system, adjusts the valve opening degree of the air supply line valve mechanism or the air exhaust line valve mechanism to keep the space at the slightly negative pressure.

8. The vertical heat treatment apparatus according to claim 1, wherein the pressure detection system includes a pressure detector tube that penetrates through the furnace body, and a pressure sensor provided at the outlet of the pressure detector tube.

9. A method for cooling a vertical heat treatment apparatus comprising:
   a furnace body having a heating section in the inner circumferential surface;
   a treatment container for housing a plurality of objects to be treated and which is disposed in the furnace body and defines a space between it and the furnace body;
   a plurality of air outlets provided in a vertical direction in an air outlet formation area of the furnace body;
   an air supply line, connected to the furnace body, for supplying a cooling air to the space via the plurality of air outlets;
   an air exhaust line, connected to the furnace body, for exhausting the cooling air from the space;
   a blower provided in at least one of the air supply line and the air exhaust line;
   an air supply line valve mechanism and an air exhaust line valve mechanism provided in the air supply line and the air exhaust line, respectively;
   a pressure detection system for detecting the pressure in the space between the furnace body and the treatment container; and
   a control section for controlling, based on a detection signal from the pressure detection system, at least one of the blower provided in at least one of the air supply line and the air exhaust line, the air supply line valve mechanism and the air exhaust line valve mechanism to keep the space at a slightly negative pressure,
   wherein the air outlet formation area is formed in the vertical direction in the furnace body by the plurality of air outlets, and the pressure detection system is provided in a space area that is formed in the vertical direction in the furnace body, corresponding to the air outlet formation area, of the space between the furnace body and the treatment container, said method comprising:

a first cooling step of supplying the cooling air to the space between the furnace body and the treatment container through the air supply line and exhausting the cooling air from the space through the air exhaust line by actuating the blower with the control section; and a second cooling step of controlling, based on the detection signal from the pressure detection system which indicates a decrease in the pressure in the space from that in the first cooling step due to decrease in the temperature of the space, at least one of the blower, the air supply line valve mechanism and the air exhaust line valve mechanism with the control section to supply a larger amount of the cooling air than that in the first cooling step to the space.

10. The method according to claim 9, wherein the space is kept at the slightly negative pressure in the range of 0 Pa to −85 Pa.

11. The method according to claim 9, wherein the space is kept at the slightly negative pressure in the range of −20 Pa to −30 Pa.

12. The method according to claim 9, wherein the air supply line and the air exhaust line are connected to each other and constitute a closed air supply/air exhaust line system, and the blower is provided for air supply and air exhaust in the closed air supply/air exhaust line system.

13. The method according to claim 9, wherein the air supply line and the air exhaust line are provided independently of each other and constitute an open air supply/air exhaust line system, and the blower includes an air supply blower provided in the air supply line and an air exhaust blower provided in the air exhaust line.

14. The method according to claim 9, wherein the control section, based on the detection signal from the pressure detection system, controls the rotational speed of the blower provided in at least one of the air supply line and the air exhaust line to keep the space at the slightly negative pressure.

15. The method according to claim 9, wherein the control section, based on the detection signal from the pressure detection system, adjusts the valve opening degree of the air supply line valve mechanism or the air exhaust line valve mechanism to keep the space at the slightly negative pressure.

16. The method according to claim 9, wherein the pressure detection system includes a pressure detector tube that penetrates through the furnace body, and a pressure sensor provided at the outlet of the pressure detector tube.

* * * * *